United States Patent
Hsu et al.

(10) Patent No.: US 12,526,948 B2
(45) Date of Patent: Jan. 13, 2026

(54) CABLE MODULES WITH POGO PINS FOR IDENTIFICATION OF CABLE MODULE MOUNTING LOCATION ON CABLED BACKPLANE PANEL

(71) Applicant: HEWLETT PACKARD ENTERPRISE DEVELOPMENT LP, Spring, TX (US)

(72) Inventors: Chi-Sheng Hsu, New Taipei (TW); Hsueh-Yu Chao, Taipei (TW); Chao-Ming Chang, Taoyuan (TW); Hung-Chu Lee, New Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 199 days.

(21) Appl. No.: 18/428,027

(22) Filed: Jan. 31, 2024

(65) Prior Publication Data
US 2025/0247985 A1 Jul. 31, 2025

(51) Int. Cl.
| | |
|---|---|
| *G06F 1/16* | (2006.01) |
| *H01R 12/55* | (2011.01) |
| *H01R 12/75* | (2011.01) |
| *H01R 13/24* | (2006.01) |
| *H05K 5/00* | (2025.01) |

(Continued)

(52) U.S. Cl.
CPC .......... *H05K 7/1439* (2013.01); *H01R 12/55* (2013.01); *H01R 12/75* (2013.01); *H01R 13/2421* (2013.01); *H05K 7/1452* (2013.01); *H05K 7/1498* (2013.01); *H01R 2201/06* (2013.01)

(58) Field of Classification Search
CPC .. H05K 7/1439; H05K 7/1452; H05K 7/1498; H05K 7/1485; H05K 7/1438; H01R 12/55; H01R 12/75; H01R 12/71; H01R 12/57; H01R 12/58; H01R 12/51; H01R 13/2421; H01R 13/2414; H01R 13/2428; H01R 13/2407
See application file for complete search history.

(56) References Cited

U.S. PATENT DOCUMENTS

| | | |
|---|---|---|
| 9,844,144 B1 | 12/2017 | Al-Momani et al. |
| 10,224,660 B2 | 3/2019 | Kurumaddali |

(Continued)

FOREIGN PATENT DOCUMENTS

CN 217545140 U 10/2022

*Primary Examiner* — Anthony M Haughton
(74) *Attorney, Agent, or Firm* — Jones Robb PLLC

(57) ABSTRACT

A cable module comprises a connector printed circuit assembly (PCA) and a cable electrically connected to the connector PCA. The connector PCA includes a printed circuit board (PCB); a connector mounted to the PCB and configured to receive a drive connector of a media drive of an information processing device; and pogo pins mounted to the PCB. The cable module is configured to be mounted to a cable module mounting location of a backplane panel. The pogo pins are positioned to engage the backplane panel in a mounted state of the cable module to the backplane panel. A microcontroller may, in a mounted state of the cable module to the backplane panel, receive output signals from the pogo pins and determine identification information of the cable module mounting location to which the cable module is mounted based on the output signals from the pogo pins.

20 Claims, 8 Drawing Sheets

(51) Int. Cl.
*H05K 7/00* (2006.01)
*H05K 7/14* (2006.01)

(56) References Cited

U.S. PATENT DOCUMENTS

| | | | |
|---|---|---|---|
| 2009/0269019 A1* | 10/2009 | Andrus | H04Q 1/155 |
| | | | 385/135 |
| 2013/0083494 A1* | 4/2013 | Syal | H01L 23/13 |
| | | | 361/752 |
| 2014/0247569 A1* | 9/2014 | Foisy | H05K 7/1452 |
| | | | 361/759 |
| 2014/0302888 A1* | 10/2014 | Syal | H04M 1/0256 |
| | | | 455/552.1 |
| 2016/0356842 A1 | 12/2016 | Lee | |
| 2018/0166809 A1* | 6/2018 | Brogan | H01R 13/2407 |
| 2018/0364869 A1* | 12/2018 | Lee | G06F 3/0421 |

* cited by examiner

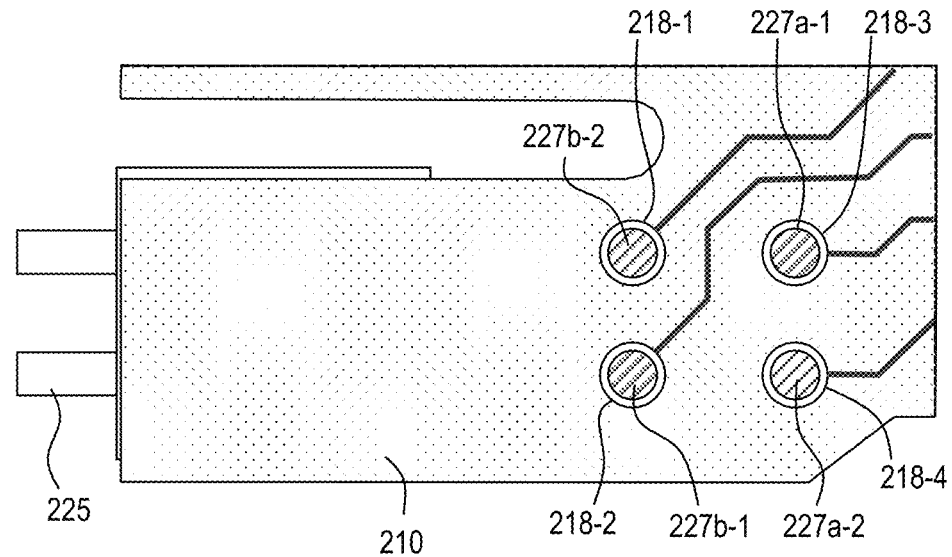
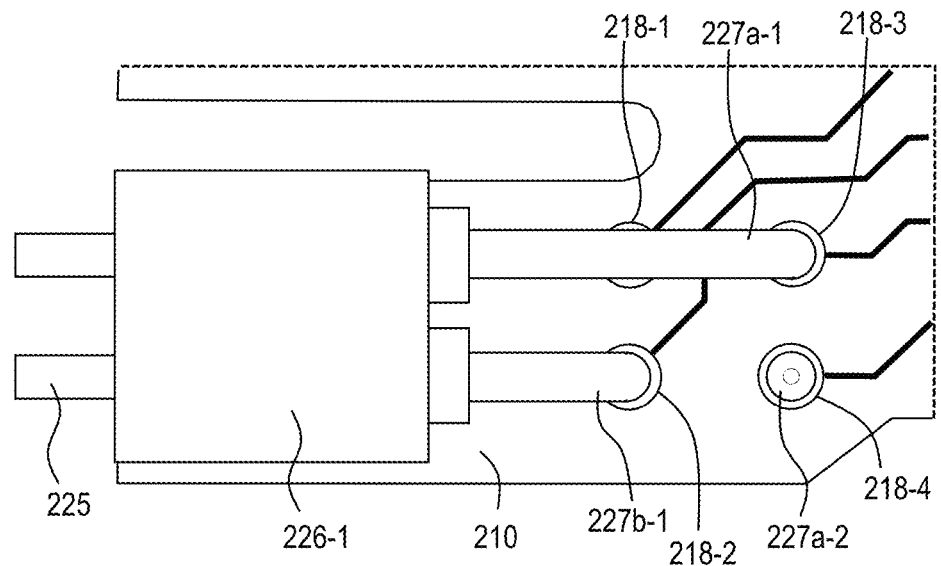
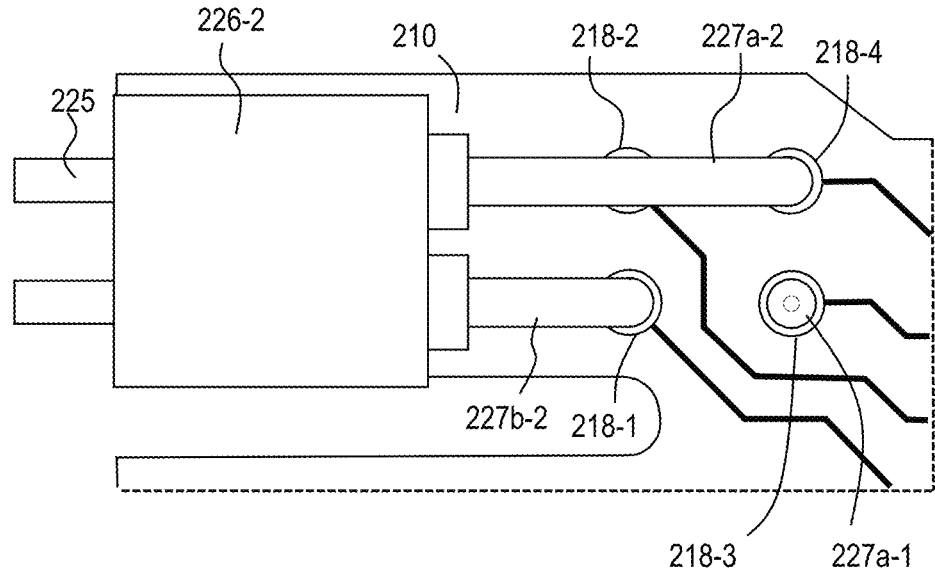

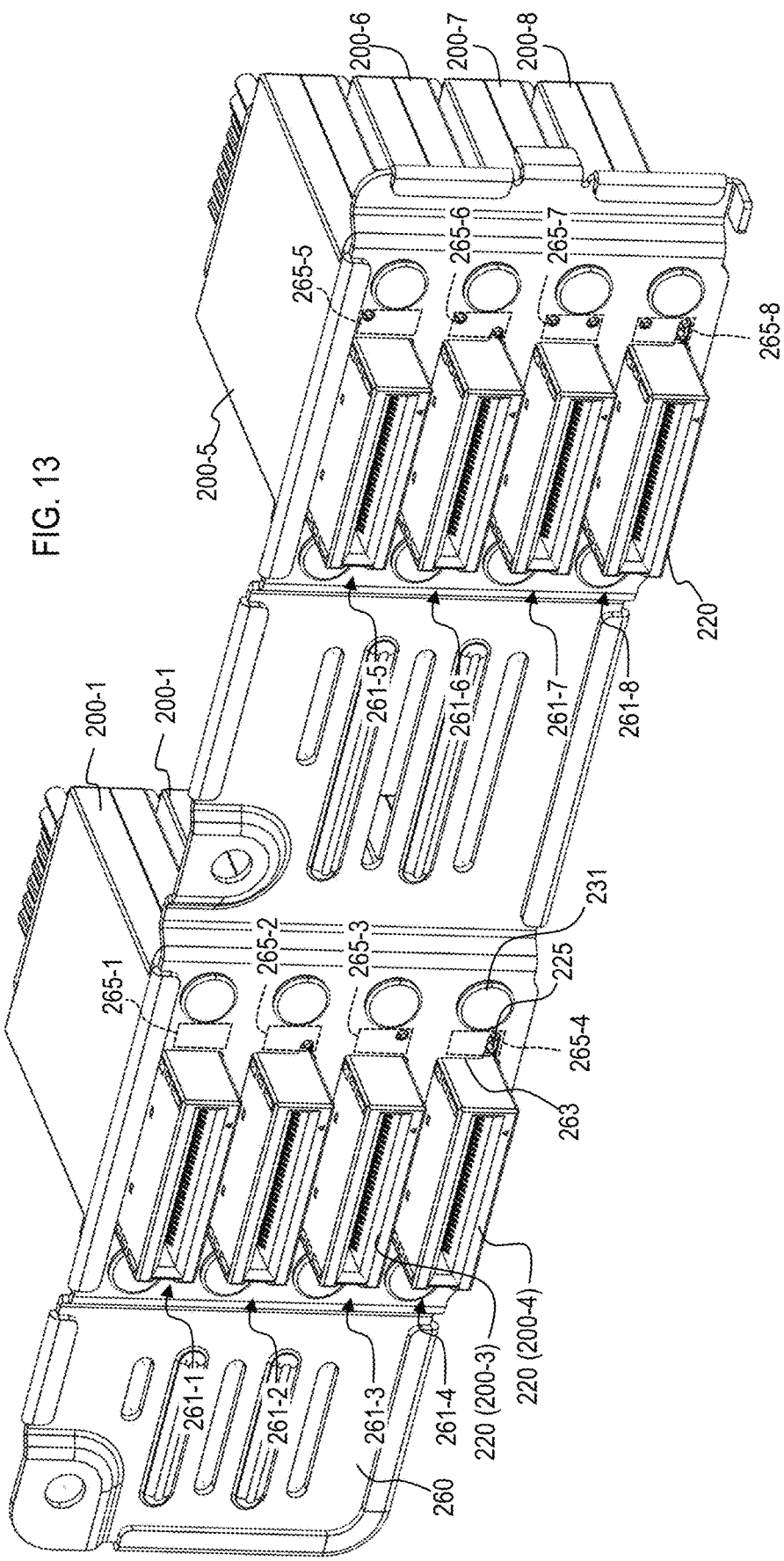

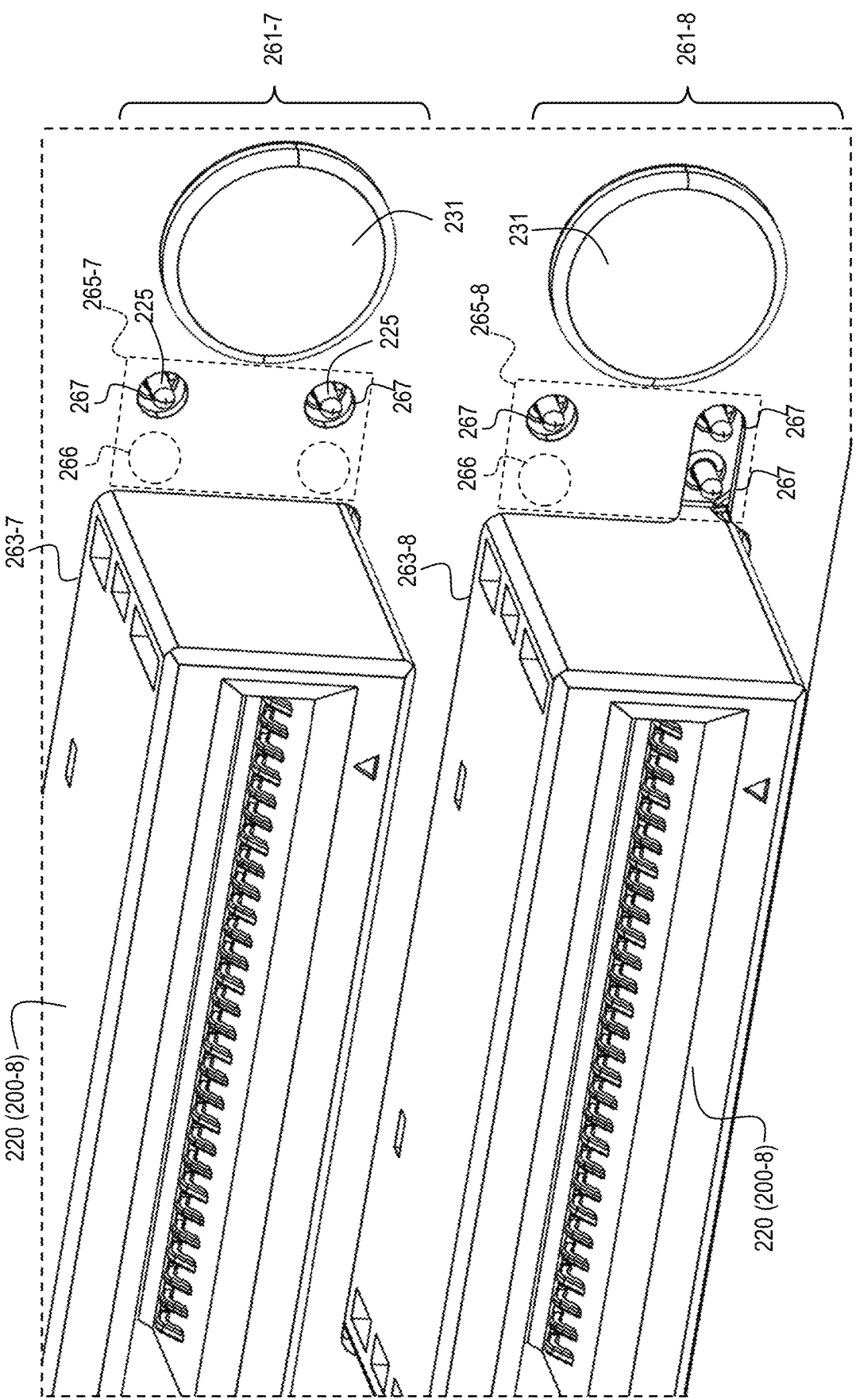

CABLE MODULES WITH POGO PINS FOR IDENTIFICATION OF CABLE MODULE MOUNTING LOCATION ON CABLED BACKPLANE PANEL

INTRODUCTION

Computers, such as servers, generally include a system board (e.g., a motherboard) and various components mounted to the system board, such as a processor, memory, etc. In addition, some computers comprise removable media drives, such as removable storage drives (e.g. solid-state drives (SDDs)). These removable media drives are usually connected to the system board in a manner that allows for easy connection or disconnection thereof without requiring the disassembly of the computing device (e.g., without requiring opening of the chassis). Moreover, the removable modules are often hot-pluggable, meaning they can be installed or removed while the system is powered on.

The chassis of the computer may comprise bays which are arranged to receive the removable media drives. In many systems, the bays are configured to allow for easy insertion and/or removal of the removable media drives from the exterior of the chassis (e.g., via a front panel or rear panel). The bays may comprise support, alignment, and attachment structures to engage the removable media drives in the bay. In addition, blind mate connectors are generally provided in the bays at predetermined positions arranged such that drive connectors of the media drives engage with the connectors of the bays when the media drives are inserted into the bays.

The blind mate connectors for the removable media drives are generally disposed on a supporting structure, often referred to as a backplane, which is coupled to the chassis and extends across the rear the bays. The backplane holds the connectors in the aforementioned predetermined positions to allow for blind-mating with the media drive connectors upon insertion. In some systems, the backplane comprises a printed circuit board assembly (PCA), and the blind mate connectors are mounted to the PCA and electrically connected to circuitry in the PCA. This internal circuitry in the PCA is communicably connected to the system board, often by board-to-board electrical connections. Thus, in such systems, communications between the system board and the media drives may pass through the backplane and the blind mate connectors mounted thereto.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings:

FIG. 10 is cross-sectional view of a portion of the connector PCA of the cable module of FIG. 2, taken along a centerline of the PCB of the PCA.

FIG. 11 is a top view of a portion of the connector PCA of the cable module of FIG. 2.

FIG. 12 is a bottom view of a portion of the connector PCA of the cable module of FIG. 2.

FIG. 13 is a perspective view of an example backplane panel with multiple instances of the cable module of FIG. 2 mounted thereto.

FIG. 14 is an enlarged perspective view of a portion of the backplane panel of FIG. 13.

DETAILED DESCRIPTION

Figure 1:
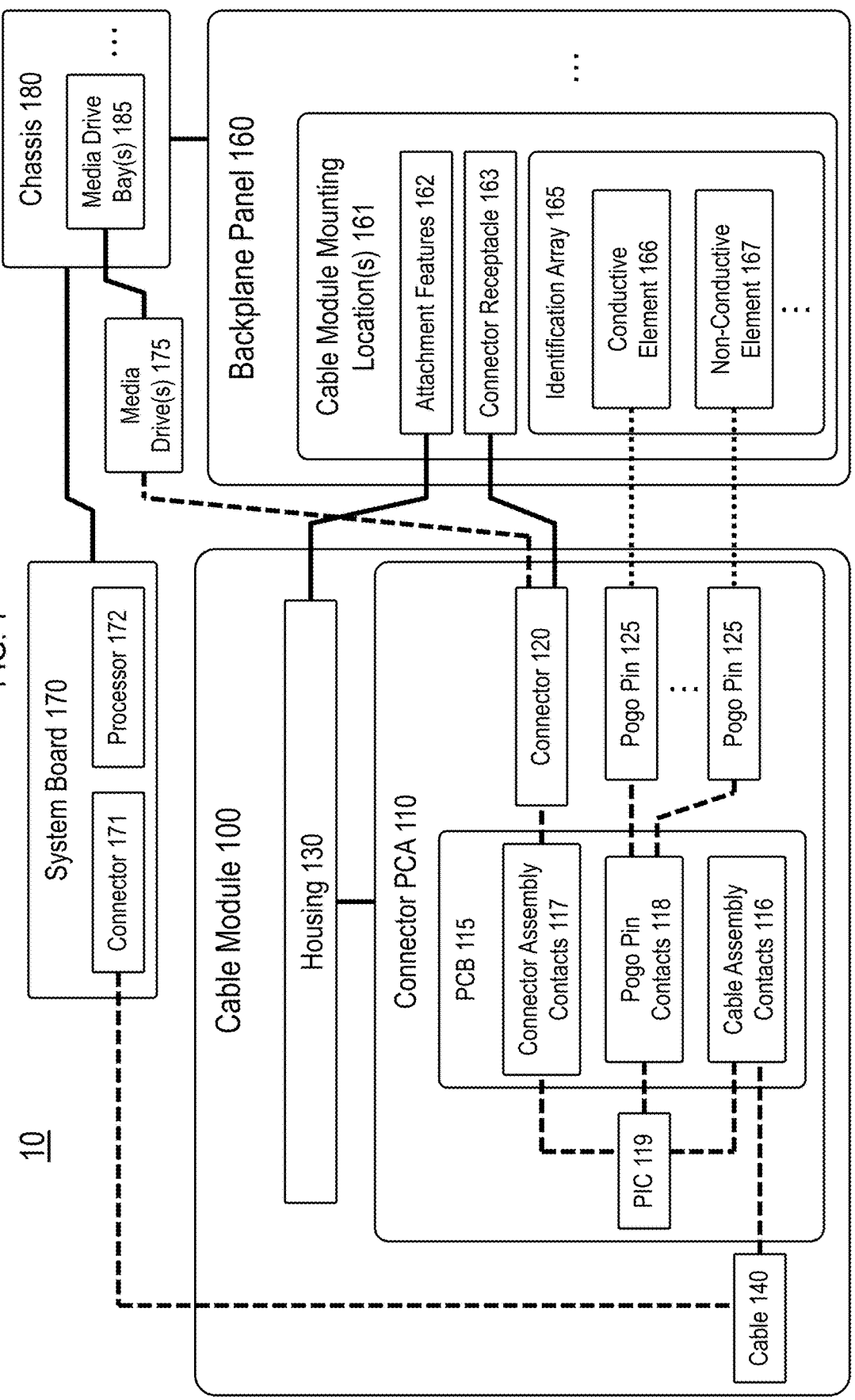
FIG. 1 is a block diagram illustrating an example cable module and an example computing system comprising the cable module.

In some newer computing systems, instead of including a PCA-based backplane to support blind mate connectors for media drive bays, cabled backplane assemblies are provided. In a cabled backplane assembly, cables are attached to a supporting structure, such as a metal panel, which is referred to herein as a backplane panel. These cables comprise cable modules disposed at the ends thereof, which comprise a connector (which may be similar to the blind mate connectors used in PCA-based backplanes) as well as other circuitry, such as a peripheral interface controller (PIC) chip. The backplane panel holds connectors of the cable modules in predetermined locations which are aligned with the bays, similar to how the PCA-based backplanes would hold their connectors in the predetermined positions. However, unlike PCA-based backplanes, in the cabled backplane assembly, the backplane panel is generally passive and does not generally participate in the communication of data signals between the media drives and the system board. Instead, in a cabled backplane assembly, each connector has its own individual cable which communicably connects it to the system board. Cabled backplane assemblies can sometimes be less expensive to produce than PCA backplanes and may also be easier to repair or upgrade, and thus they are becoming more popular.

However, with cabled backplanes it can be challenging for the system to identify which bay a given media drive is installed in. Each bay may have an identifier (e.g. a number) associated with it, and the system generally needs to know which bay each media drive is installed in. With a PCA backplane, this identification is relatively straightforward, as each connector is permanently mounted at a predetermined position which is known to a controller in the backplane. Because the controller knows the position of each connector, it can assign a bay number to each of the connectors which matches the position of the connector. Then, whenever a media drive is plugged in, the controller can identify which connector the media drive is connected to and assign that media drive the bay number which is associated with the connector.

However, the above-described approach to bay identification may not work with a cabled backplane because, unlike in a PCA backplane, the locations of the connectors might not be known to the system. In particular, when the cabled backplane is assembled, the connectors of the cable modules may be connected to the backplane panel in a variety of different arrangements, and the system may not have any way of knowing which cable module is located at which mounting location. It may be possible for a user to manually determine which cables are connected to which mounting locations and program that information into the system, but this would require substantial effort and would have a high likelihood of error.

To address these issues, disclosed herein are techniques for automatically identifying the mounting locations of cable modules in a cabled backplane. Cable modules disclosed herein may comprise pogo pins mounted to a printed circuit board (PCB) of the cable module, wherein the pogo pins are arranged to engage with the backplane panel when the cable module is connected thereto. A controller of the cable modules is configured to monitor the outputs of the pogo pins and to determine a mounting location of the cable module on the backplane panel based on the pogo pin outputs. In this manner, because the controller can determine the mounting location of each cable module, the controller can associate a bay number with each cable module and therefore the system can identify which bay a given media drive is inserted into when the given media drive connects to one of the connectors.

As noted above, the mounting locations of the cable modules is identified based on the outputs of the pogo pins, and these outputs depend on how the pogo pins interact with the backplane panel. The pogo pins may engage with the backplane panel in two ways: either the pogo pin engages a conductive element of the backplane panel (e.g., by contacting a conductive portion of the backplane panel itself), or the pogo pin engages a non-conductive element of the backplane panel (e.g., by passing through an opening in the backplane panel or contacting a non-conductive material on the panel). If the pogo pin engages a conductive element, this completes a circuit and results in a first output signal being generated by the pogo pin. On the other hand, if the pogo pin engages a non-conductive element, the circuit is not completed and thus a second output signal is generated by the pogo pin. Thus, by arranging conductive and non-conductive elements in predetermined patterns at the locations where the pogo pins will engage with them, identification information can be encoded into the backplane panel for each cable module mounting location.

More specifically, each cable module mounting location of the backplane panel may be provided with a corresponding identification array. Each identification array comprising an array of conductive elements and/or non-conductive elements arranged at locations which are aligned with the pogo pins of a cable module when the cable module is mounted at the cable module mounting location associated with the identification array. The pattern of conductive and non-conductive elements in a given identification array may uniquely identify the associated cable module mounting location, and this identify may be communicated to the controller of the cable module by the signals output by the pogo pins when they interact with the identification array.

Moreover, in some examples, the pogo pins of each cable module may be provided in the form of two units comprising two pogo pins each, with a first pogo pin unit being arranged on a top side of the PCB of the cable module and a second pogo pin unit being arranged on a bottom side of the PCB directly opposite from the first pogo pin unit. This arrangement can allow for a more compact cable module than other possible arrangements of the pogo pins, such as an arrangement in which four pogo pins are provided on the same side of the PCB. In space constrained applications, a more compact cable module may be desired.

In addition, in some examples, each pogo pin unit is identical to the other and has two asymmetrical 90 degree attachment pins for attachment of the pogo pin unit to the PCB. Each 90 degree attachment pin includes a horizontal portion which extends parallel to the PCB and a vertical portion which extends perpendicular to the PCB. The vertical portion of the 90 degree attachment pin is to be inserted into a through-hole contact in the PCB to mount the pogo pin unit to the PCB. In some examples, the attachment pins of each pogo pin unit are asymmetrical in that the horizontal portions thereof are different lengths. This asymmetry can be beneficial in that it allows the through holes for mounting one pogo pin unit to be interleaved with the through holes for mounting the other pogo pin units, which allows the two pogo pin units to be positioned directly opposite one another on opposite sides of the PCB, thereby saving space. In contrast, if the pogo pin units each had symmetrical attachment pins, then the through holes for one pogo pin unit would interfere with the through holes for the other pogo pin unit, and thus they would not be able to be positioned directly opposite one another.

An alternative way to allow for the pogo pin units to be positioned directly opposite one another, without using the asymmetrical attachment pins, would be to provide different pogo pin units that have differently sized attachment pins—e.g., a first pogo pin unit with long symmetrical attachment pins and a second pogo pin unit with short symmetrical attachment pins. However, providing two different pogo pin units can complicate manufacture and increased costs. By using the asymmetrical attachment pins, the same identical pogo pin units can be used on both sides of the PCB, thus reducing complexity and costs.

Turning now to the figures, various devices, systems, and methods in accordance with aspects of the present disclosure will be described.

FIG. 1 is a block diagram conceptually illustrating an example computing system 10 ("system 10") and an example cable module 100. It should be understood that FIG. 1 is not intended to illustrate specific shapes, dimensions, or other structural details accurately or to scale, and that implementations of the system 10 or cable module 100 may have different numbers and arrangements of the illustrated components and may also include other parts that are not illustrated. Moreover, cable module 100 is shown in FIG. 1 and described below in an installed state in the system 10 to aid understanding, but it should be understood that some examples comprise the cable module 100 by itself (i.e., in a state not installed in the system 10).

In FIG. 1, a physical connection between two elements is indicated by a solid line extending therebetween, an electrical connection between two elements is indicated by a dashed line extending therebetween, and engagement between two elements is indicated by a dotted line extending therebetween.

As shown in FIG. 1, computing system 10 comprises a chassis 180, a system board 170 supported by the chassis 180, a backplane panel 160 attached to the chassis 180, and one or more cable modules 100 connected to the backplane panel 160.

The chassis 180 may include a base, walls, and support structures as would be familiar to those of ordinary skill in the art. In addition, the chassis 180 may include one more (in some examples, multiple) media drive bays 185 configured to removably receive media drives 175. For example, in some implementations the bays 185 are configured to receive media drives 175 having a form factor specified by one of the Enterprise and Datacenter Standard Form Factor (EDSFF) standards, such as one of the E1 form factors as specified in SNIA-SFF-TA-1006 or one of the E3 form factors as specified in SNIA-SFF-TA-1008. In other implementations, the bays 185 are configured to receive media drives 175 having a form factor specified by an Open Compute Project (OCP) standard, such as the OCP NIC 3.0 standard. In other implementations, the bays 185 are configured to receive media drives 175 having a U.2 or U.3 form factor. In other implementations, the bays 185 are configured to receive media drives 175 having other form factors.

System board 170 may comprise, for example, a mother board or host processor module, and comprises at least a processor 172. IN addition, system board 170 may comprise one or more connectors 171 to connect to the cables 140 of the cable modules 100, as described in greater detail below.

Backplane panel 160 comprises a metal plate, panel, or frame which is attached to the chassis 180 and extends across a rear of the bays 185. The backplane panel 160 comprises a plurality of cable module mounting locations 161 (only one is illustrated in FIG. 1), with each cable module mounting location 161 being aligned with a corresponding one of the bays 185. The cable module mounting locations 161 are each configured to receive one cable module 100 to mount the cable module 100 to the backplane panel 160. In particular, each cable module mounting location 161 may include a connector receptacle 163 into which a connector 120 for the cable module 100 is inserted. In addition, in some examples additional attachment features 162, such as screw holes, friction-fit attachment features, snap fit attachment features, etc. may be provided at the cable module mounting locations 161 to further secure the cable modules 100 to the backplane plane 160. Each cable module mounting location 161 also comprises a corresponding identification array 165, which encodes a unique identification of the cable module mounting location 161, as will be described in greater detail below in connection with the description of the cable module 100.

The cable module 100 comprises a cable 140, a connector PCA 110 connected to one end of the cable 140, and a housing 130 which supports and/or houses the connector PCA 110. The cable module 100 may also comprise a second connector (not illustrate) which is disposed at an opposite end of the cable 140 and connected to the connector 171 of the system board 170.

The connector PCA 110 comprises a printed circuit board (PCB) 115, a connector 120 mounted to the PCB 115 and pogo pins 120 mounted to the PCB 115. In some examples, the connector PCA 110 also comprises a PIC microcontroller 119 mounted to the PCB 115.

The PCB 115 may comprise cable assembly contacts 116 which are electrically connected (e.g., soldered) to the conductors of the cable 140. The PCB 115 may also comprise connector assembly contacts 117 which are electrically connected with electrical pins in the connector 120. The connector assembly contacts 117 may also be electrically connected with the PIC 119 and/or the cable assembly contacts 116 via conductive traces in the PCB 115. Thus, electrical signals may be communicated between the cable 140 and the connector 120 via the contacts 116 and 117 and the conductive traces running therebetween (and in some cases, via the PIC 119).

The connector 120 may be an electrical connector configured to blind mate connect with a drive connector of one of the media drives 175. Specifically, in some examples, the media drives 175 may comprise edge connectors, in which case the connector 120 may be a complementary edge-connector socket configured to receive the edge connectors. In some examples, the connector 120 comprises a Gen Z connector as specified in the Gen-Z Scalable Connector Standard. In some examples, the connector 120 may comprise an EDSFF connector (which may include a Gen-Z connector, in some cases), such as an EDSFF 1C, 2C, 4C, or 4C+ connector. In some examples, the connector 120 may comprise an OCP connector (which may include a Gen-Z connector, in some cases), such as an OCP 4C, or 4C+ connector. The connector 120 is configured to be inserted into the connector receptacle 163 of a cable module mounting location 161 of the backplane panel 160, and when so inserted the connector 120 is positioned so as to be aligned with the drive connector of a media drive 175 when the media drive 175 is inserted into the bay 185 which corresponds to the cable mounting location 161, such that the drive connector and connector 120 can blind mate connect with one another.

Generally, at least two pogo pins 120 are provided. Pogo pins 120 are electrical connectors which comprise a housing and a spring loaded conductive pin which can be forced to move relative to the housing by compressing the spring. In some examples, the pogo pins 120 are provided as part of pogo pin units, wherein each pogo pin unit comprises a discrete device which comprises one or more pogo pins 120. For example, multiple pogo pins 120 may share the same housing as one another, thus forming a pogo pin unit with multiple pogo pins 120.

The pogo pins 120 may be mounted to the PCB 115 via pogo pin contacts 118. The pogo pin contacts 118 may be, for example, plated through holes into which attachment pins of the pogo pins 120 are inserted and soldered. These pogo pin contacts 118 may be electrically connected to the PIC 119 and/or to the cable assembly contacts 116 by internal conductive traces of the PCB 115.

The pogo pins 120 are provided to facilitate identification of the cable module mounting locations 161. The more pogo pins 120 that are provided, the more cable module mounting locations 161 can be uniquely identified. However, pogo pins 120 also take up valuable space of the PCA 110, and thus in some cases it may be beneficial to provide a minimum number of pogo pins 120 needed to identify the cable module mounting locations 161. Generally, each pogo pin 125 can provide two bits of data, and thus N pogo pins 120 can provide unique identification of up to $2^N$ cable module mounting locations 161. In some examples, four pogo pins 120 are provided, which can provide unique identification for up to sixteen cable module mounting locations 161. This arrangement allows for a very space efficient connector PCA 110. However, any number of pogo pins 120 may be provided, as long as space allows.

In some examples, each pogo pin unit comprises two pogo pins 120 and has two attachment pins. In other examples, each pogo pin unit may comprise more pogo pins 120 and more attachment pins, such as three, four, or more pogo pins 120. In still other examples, each pogo pin unit may comprise a single pogo pin 125.

In some examples, four pogo pins 120 are provided in the form of two pogo pin units which each comprise two pogo pins 120 and which are disposed on opposite faces of the PCB 115. In some examples, the two pogo pin units are disposed directly opposite one another. In some examples, the two pogo pin units have asymmetrical attachment pins. FIGS. 2-15 illustrate one such example, which is described in greater detail below.

As noted above, each of the cable mounting locations 161 comprises an identification array 165. Each identification array 165 comprises an array of identification elements located at predetermined positions in the array. The number of identification elements in each array 165 may be the same as the number of pogo pins 120 in each cable module 100, and the locations of each identification element in the array 165 may correspond with the locations of the pogo pins 120. More specifically, the identification array 165 of a given mounting location 161 is positioned adjacent to the connector receptacle 163 of the mounting location 161 such that, when a cable module 100 is mounted to the given mounting location 161, each pogo pin 125 of the cable module 100 is aligned with one of the positions in the array and thus is engaged with one of the identification elements at that position. Each identification element may be either a conductive element 166 or a non-conductive element 167. Each identification array 165 is encoded with unique identification information of the corresponding mounting location 161 based on the pattern of conductive vs non-conductive elements 166 and 167 in the array, i.e., based on which positions of the array comprise conductive elements 166 and which positions comprise non-conductive elements 167. For example, each position in the array may encode a single bit of the identification information, with first value (e.g., 0) being encoded by the presence of a conductive element 166 at the position and a second value (e.g., 1) being encoded by the presence of a non-conductive element 167 at the position.

The conductive elements 166 of the identification arrays 165 may all be connected to a power source and have a first predetermined voltage applied thereto. The non-conductive elements 167, on the other hand, are isolated and do not carry any applied voltage. In addition, each pogo pin 125 may be connected to a resistor inside the cable module 110, which is in turn connected to a second predetermined voltage supplied from the connector PCA 110. Thus, when the pogo pin 125 is not engaged with anything or when it is engaged with one of the non-conductive elements 166, the voltage of the pogo pin 125 is pulled up through the resistor to the second predetermined voltage. This voltage can be sensed by a controller (e.g., PIC 119) and indicates a first value of the bit represented by the pogo pin 125. On the other hand, when the pogo pin 125 comes into contact with one of the conductive elements 166, it is shorted to the first predetermined voltage which is carried by the conductive element 166. When the pogo pin 125 is at the first voltage, this indicates a second value of the bit represented by the pogo pin 125. Thus, the PIC 119 or other controller connected to the pogo pin 125 can read a binary bit value from the pogo pin 125 based on which voltage the pogo pin 125 has. In some examples, the first predetermined voltage is a ground voltage. In some examples, the second predetermined voltage is 3.3 V.

In examples in which the backplane panel is conductive, the conductive elements 166 may comprise a portion of the backplane panel 160. In other words, in these examples the conductive elements 166 is not a separate and distinct structure, but rather is a portion of the larger panel 160. In these examples, the backplane panel 160 may be connected to a power source and have the first predetermined voltage (e.g., ground) applied thereto.

In other examples, the conductive elements 166 may comprise a contact pad or other distinct conductive body which is attached to the panel 160. In these examples, each such conductive element 116 may be connected to a power source and have the first predetermined voltage (e.g., ground) applied thereto.

In some implementations, the non-conductive elements 167 comprise apertures in the panel 160, and a pogo pin 125 may engage with such a non-conductive element 167 by extending through the aperture (without contacting the panel 160). As another example, in some implementation the non-conductive elements 167 comprise an insulator (e.g., rubber or silicon) disposed on the panel 160, and the pogo pins 120 engage such non-conductive elements by contacting the insulator.

In some examples, the PIC 119 may monitor the voltage of the pogo pins 120 and determine identification information of the cable module mounting location 161 based on the voltage of the pogo pins 120. For example, in some implementations there are four pogo pins 120-1, 120-2, 120-3, and 120-4 and eight cable module mounting locations 161, and the identification information for the mounting locations 161 may be encoded as shown in the following table, wherein a "0" indicates the pogo pin 125 has engaged a conductive element 166 and is thus at the first voltage (e.g., ground) and a "1" indicates the pogo pin 125 has engaged a non-conductive element 167 and is thus at the second voltage (e.g., 3.3 V). Of course, this is merely one illustrative example, and any other desired encoding scheme could be used.

TABLE 1

| Mounting Location ID | Output of Pogo Pin 125-1 | Output of Pogo Pin 125-2 | Output of Pogo Pin 125-3 | Output of Pogo Pin 125-4 |
|---|---|---|---|---|
| 1 | 0 | 0 | 0 | 0 |
| 2 | 0 | 0 | 0 | 1 |
| 3 | 0 | 0 | 1 | 0 |
| 4 | 0 | 0 | 1 | 1 |
| 5 | 0 | 1 | 0 | 0 |
| 6 | 0 | 1 | 0 | 1 |
| 7 | 0 | 1 | 1 | 0 |
| 8 | 0 | 1 | 1 | 1 |

Turning now to FIGS. 2-15, an example cable module 200 and backplane panel 260 will be described. The cable module 200 is one example implementation of the cable module 100, and the backplane panel 260 is one example implementation of the backplane panel 160. Thus, the cable module 200 and the backplane panel 260 each comprise components corresponding to (e.g., example implementations of) components of the cable module 100 and the backplane panel 160 described above. Such corresponding components are given similar reference numbers having the same last two digits, such as 110 and 210. Aspects of the components of the cable module 100 and backplane panel 160 described above may be applicable to the corresponding components of the cable module 200 and backplane panel 260, and thus duplicative description of those aspects already described above is omitted below.

FIGS. 2-12 illustrate the cable module 200. The cable module 200 comprises a connector PCA 210 which comprises a PCB 215, a connector 220 mounted to the PCB 215, two pogo pin units 226 (i.e., pogo pin units 226-1 and 226-2) mounted to the PCB 215, and a cable 240 connected to PCB 215. Connector PCA 210 may also comprise a PIC, which is not illustrated, mounted to the PCB 215. Cable module 200 may also comprise a housing 230, which houses the PCB 215, as well as attachment features 231 (e.g., screws) which can be used attach the cable module 200 to the backplane panel 260.

Figure 2:
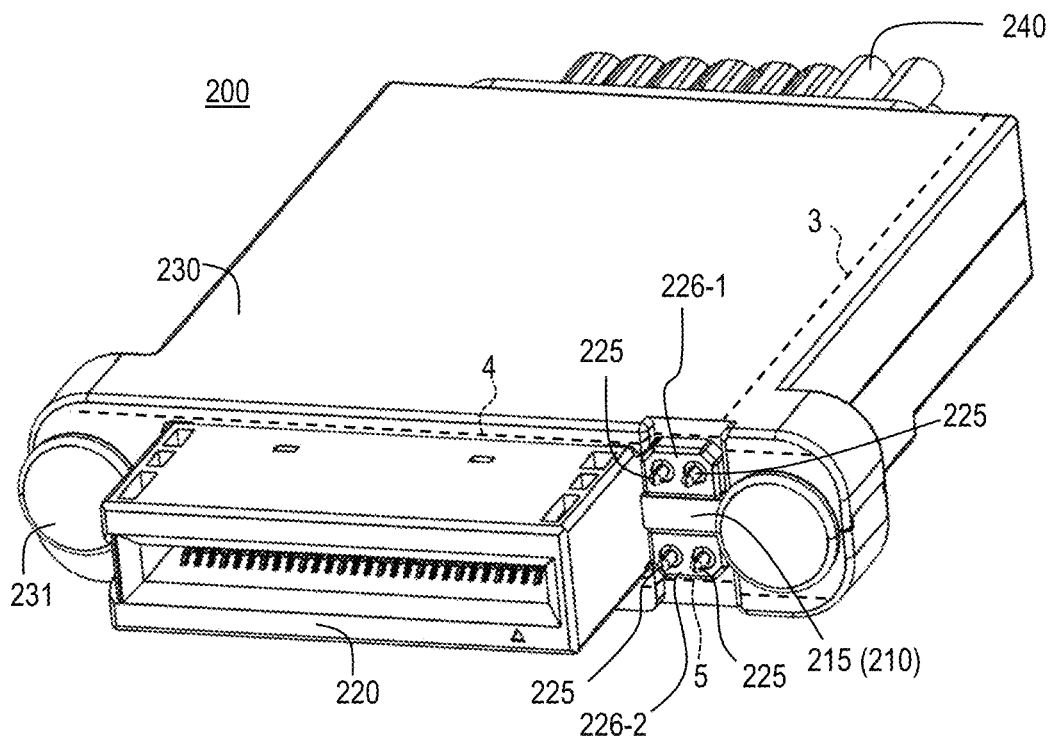
FIG. 2 is a perspective view of another cable module.
Figure 3:
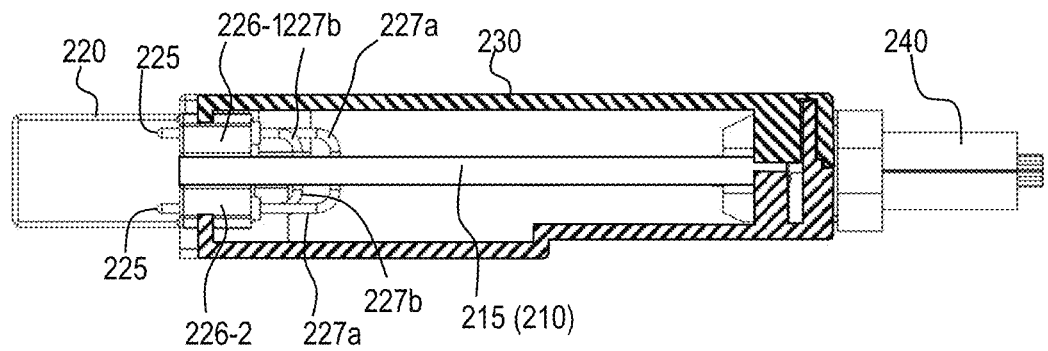
FIG. 3 is a cross-section the cable module of FIG. 2, taken along the line 3 indicated in FIG. 2.
Figure 4:
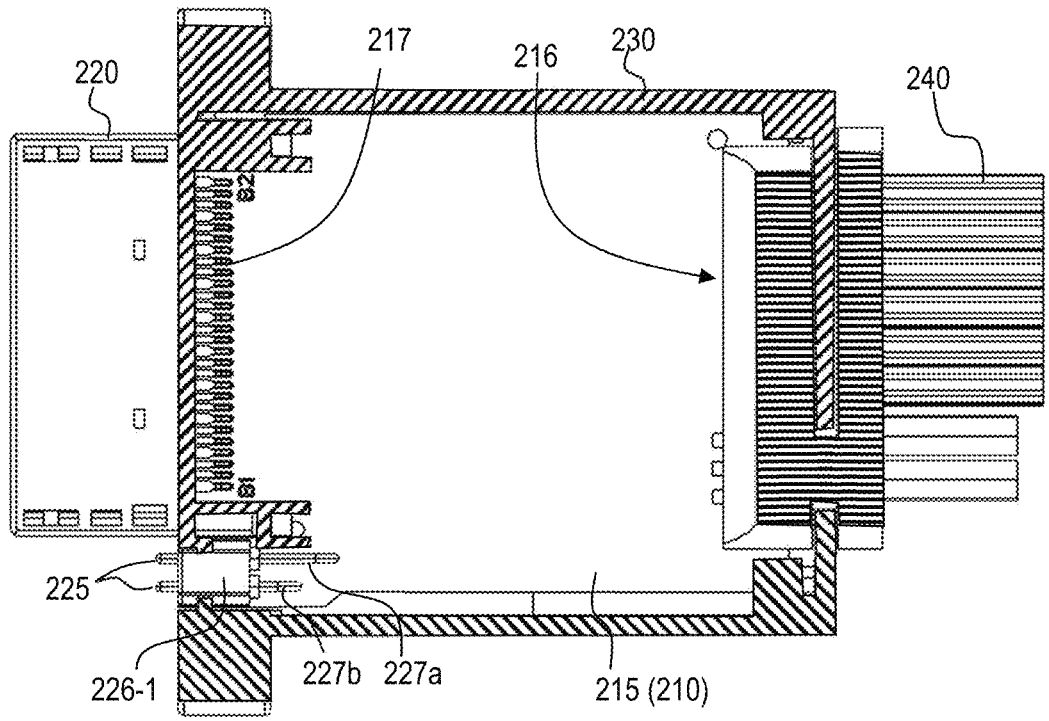
FIG. 4 is a cross-section the cable module of FIG. 2, taken along the line 4 indicated in FIG. 2 and facing a top surface of the connector PCA of the cable module.
Figure 5:
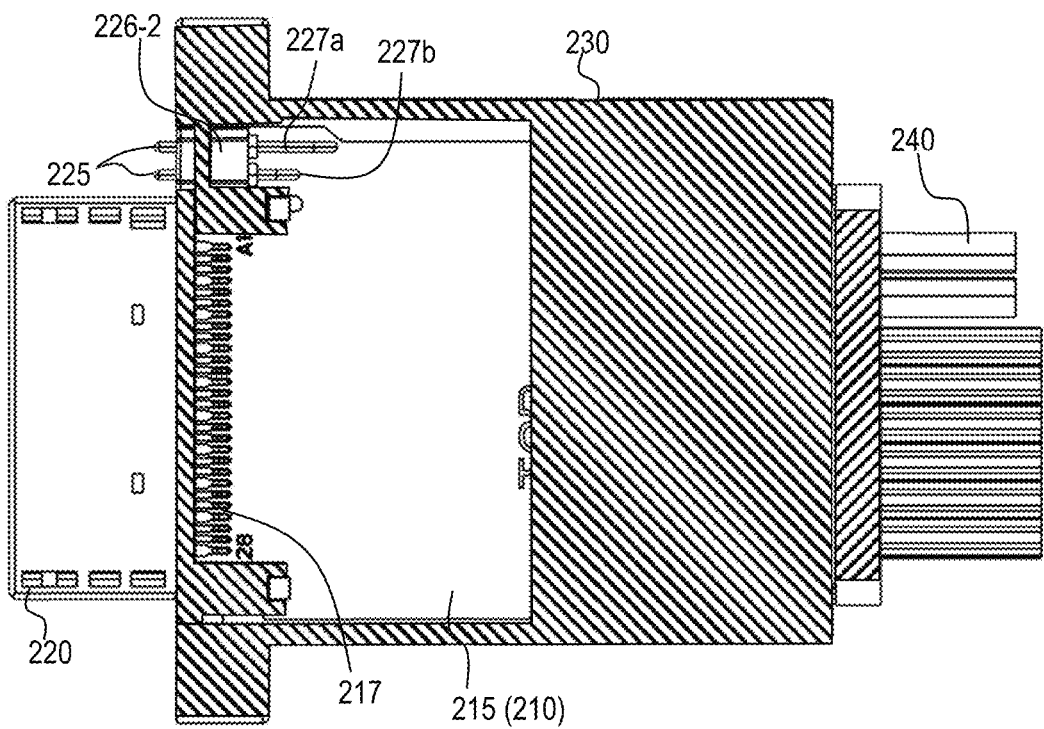
FIG. 5 is a cross-section the cable module of FIG. 2, taken along the line 5 indicated in FIG. 2 and facing a bottom surface of the connector PCA.
Figure 6:
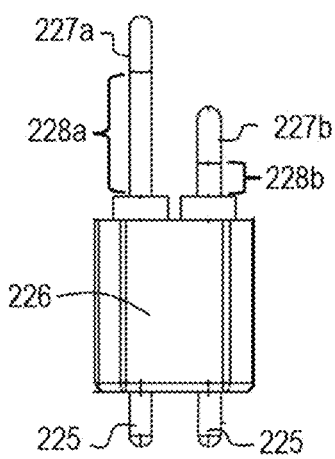
FIG. 6 is a top view of a pogo pin unit of the cable module of FIG. 2.
Figure 7:
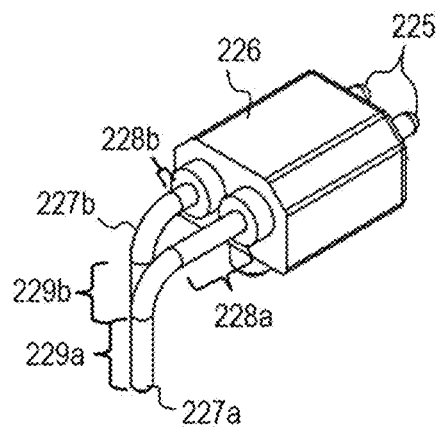
FIG. 7 is a perspective view of the pogo pin unit of the cable module of FIG. 2.
Figure 8:
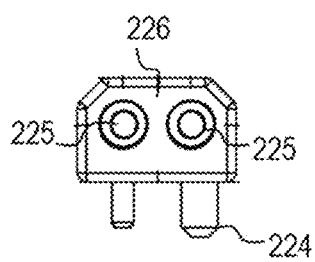
FIG. 8 is a front view of a pogo pin unit of the cable module of FIG. 2.
Figure 9:
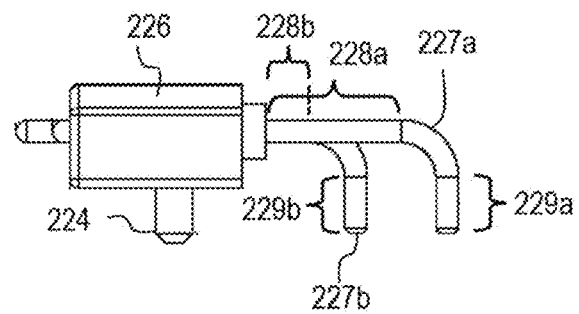
FIG. 9 is a side view of a pogo pin unit of the cable module of FIG. 2.

As shown in FIGS. 2-5, the pogo pin units 226-1 and 226-2 are mounted to opposite faces of the PCB 215. Specifically, pogo pin unit 226-1 is mounted to a top face of the PCB 215, as shown in FIGS. 2-4, and pogo pin unit 226-2 is mounted to a bottom face of the PCB 215, as shown in FIGS. 2, 3, and 5. Moreover, pogo pin units 226-1 and 226-2 are mounted directly opposite one another, as shown in FIGS. 2 and 3.

As shown in FIGS. 2 and 6-9, each of the pogo pin units 226 comprises two pogo pins 225 protruding from one side and two 90-degree attachment pins 227 protruding from an opposite side. The attachment pins 227 are asymmetrical, having horizontal portions 228 with different lengths. That is, a first attachment pin 227a has a horizontal portion 228a which is longer than a horizontal portion 228b of a second attachment pin 227b. The attachment pins 227a and 227b also comprise vertical portion 229a and 229b, respectively, which is connected to the horizontal portion 228a or 228b by a curved portion. The pogo pin units 226 also each comprise attachment features 224, which may comprise a protrusion or other attachment feature which facilitates alignment and securing of the pogo pin unit 226 to the PCB 215.

As shown in FIGS. 10-12, the asymmetrical nature of the 90-degree attachment pins 227 of the pogo pin units 226 may enable the placement of the pogo pin units 226 directly opposite one another. That is, because the attachment pins 227a have longer horizontal portions 228a than the attachment pins 227b, the attachment pins 227a and 227b of one pogo pin unit 226 can interleave with the attachment pins 227a and 227b of the other pogo pin unit 226 without interfering with one another. In particular, as shown in FIGS. 10-12, the shorter attachment pins 227b-1 and 227b-2 of the pogo pin units 226-1 and 226-2 are connected to pogo pin contacts 218-1 and 218-2 which are positioned closer to the units 226, whereas the longer attachment pins 227a-1 and 226a-2 of the pogo pin units 226-1 and 226-2 are connected to pogo pin contacts 218-3 and 218-4 which are positioned farther from the units 226. The positioning of the pogo pin units 226-1 and 226-2 directly opposite one another on opposite faces of the PCB 215 reduced the PCB 215 layout area required for the pogo pins as compared to when the pogo pins are provided on a same side of the PCB 215 or when provided on opposite sides but not directly opposite from one another.

If instead of the asymmetrical arrangement, the pogo pin units were provided with all of their attachment pins being the same length, the disposition of the pogo pin units directly opposite from one another would not be possible, as the pins of one unit would interfere with (e.g., attempt to occupy the same through hole as) the pins of the other unit. Alternatively, if the first unit had all short pins and the second unit had all long pins, the interference problem could be avoided, but then the units would no longer be identical, and therefore more discrete parts may need to be sourced and kept track of, which complicates manufacture and increases costs. In contrast, the pogo pin units 226-1 and 226-2 in the example of FIGS. 2-15 may be identical, simplifying manufacture and reducing costs.

Figure 15:
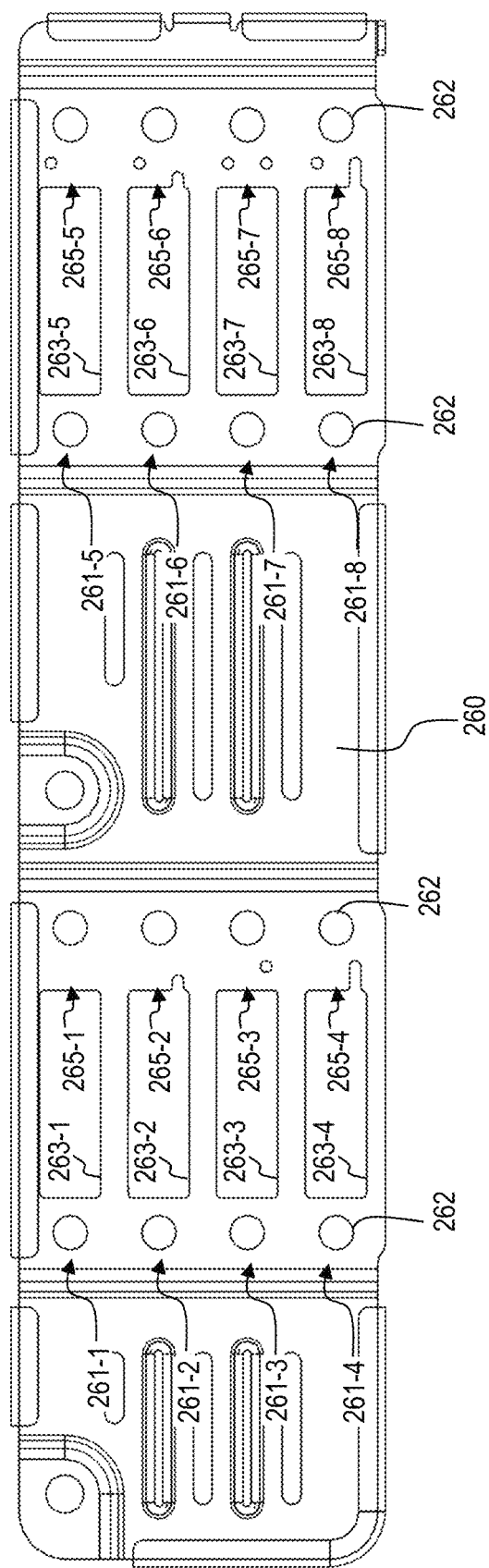
FIG. 15 is a front view of the backplane panel of FIG. 13 in a state without the cable modules mounted thereto.

As shown in FIGS. 13-15, the cable modules 200 can be connected to the backplane panel 260. As shown in FIGS. 13 and 15, the backplane panel 260 comprises eight cable module mounting locations 261-1 to 261-8, and eight cable modules 200-1 to 200-8 may be mounted to the cable module mounting locations 261-1 to 261-8, respectively. As shown in FIG. 15, each cable module mounting location 261 comprises a connector receptacle 263 (i.e., connector receptacles 263-1 to 263-8) and an identification array 265 (i.e., identification arrays 265-1 to 265-8). Each identification array 265 is positioned adjacent to the connector receptacle 263 of the same mounting location 261. Each cable module mounting location 261 may also comprise attachment features 262 in the form of holes which can receive the attachment features 231 of the cable modules 200.

As shown in FIGS. 13 and 14, in some implementations, each identification array 265 comprises an array of four identification elements, each of which is either a conductive element 266 or a non-conductive element 267. Specifically, as shown most clearly in FIG. 14, in this example, the conductive elements 266 comprise portions of the panel 260 which the pogo pins 225 contact, and the non-conductive elements 267 comprise apertures in the panel 260 through which the pogo pins 225 extend without contacting the panel. These identification elements 266 and 267 are arranged at predetermined locations which are aligned with the pogo pins 225 of the cable module 200 mounted to the mounting location 261 with which the array 265 is associated. As shown in FIG. 14, in this example, the identification elements 266 and 267 of a given array 265 are located at positions corresponding to the corners of a rectangle (i.e., the identification array 265 has the form of a 2×2 grid of identification elements 266 or 267), with two top identification elements 266 or 267 engaging the two top pogo pins 225 of the top pogo pin unit 226-1 and two bottom identification elements 266 or 267 engaging the two bottom pogo pins 225 of the bottom pogo pin unit 226-2.

As shown in FIG. 13, each identification array 265 has a unique arrangement of conductive elements 266 and non-conductive elements 267, which encodes an identification of the corresponding cable mounting location 261. As one illustrative example, in FIG. 13 the first identification array 265-1 comprises four conductive identification elements 266, which using the encoding scheme in table 1 above would encode the identifier "1" for the mounting location 261-1 and the associated bay. The second identification array 265-2 comprises three conductive identification elements 266 and one non-conductive element 267 at a lower left position in the array 265-2, which using the encoding scheme in table 1 above would encode the identifier "2" for the mounting location 261-2 and the associated bay. The third identification array 265-3 comprises three conductive identification elements 266 and one non-conductive element 267 at a lower right position in the array 265-3, which using the encoding scheme in table 1 above would encode the identifier "3" for the mounting location 261-3 and the associated bay. The fourth identification array 265-4 comprises two conductive identification elements 266 in the top two positions and two non-conductive elements 267 in the two bottom positions in the array 265-4, which using the encoding scheme in table 1 above would encode the identifier "4" for the mounting location 261-4 and the associated bay. The fifth identification array 265-5 comprises three conductive identification elements 266 and one non-conductive element 267 in the top right position in the array 265-5, which using the encoding scheme in table 1 above would encode the identifier "5" for the mounting location 261-5 and the associated bay. The sixth identification array 265-6 comprises two conductive identification elements 266 in top left and bottom right positions and two non-conductive elements 267 in top right and bottom left positions in the array 265-6, which using the encoding scheme in table 1 above would encode the identifier "6" for the mounting location 261-6 and the associated bay. The seventh identification array 265-7 comprises two conductive identification elements 266 in two left positions and two non-conductive elements 267 in the two right positions in the array 265-7, which using the encoding scheme in table 1 above would encode the identifier "7" for the mounting location 261-7 and the associated bay. Finally, the eighth identification array 265-8 comprises one conductive identification element 266 in the top left positions and three non-conductive elements 267 in the remaining positions in the array 265-8, which using the encoding scheme in table 1 above would encode the identifier "8" for the mounting location 261-8 and the associated bay. It should be understood that the encoding scheme of Table 1 is merely one example, and that any encoding scheme that is desired could be used. Moreover, it should be understood that having eight mounting locations 261 is merely one example, and that any number of mounting locations 261 could be used. For example, with four identifications elements per array 265 and four pogo pins 225 per module 200, up to sixteen unique identifiers could be encoded for up to sixteen mounting locations 261. If more mounting locations 261 than this are desired, then additional pogo pins 225 per module 200 could be added and corresponding additional identification elements per array 265.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as connected may be electronically or mechanically directly connected, or they may be indirectly connected via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. A cable module, comprising:
   a connector printed circuit assembly (PCA) comprising:
   a printed circuit board (PCB);
   a connector mounted to the PCB and configured to receive a drive connector of a media drive of an information processing device;
   a plurality of pogo pins mounted to the PCB;

a cable electrically connected to the connector PCA, wherein the cable module is configured to be mounted to a cable module mounting location of a backplane panel, and wherein the plurality of pogo pins are positioned to engage the backplane panel in a mounted state of the cable module to the backplane panel.

2. The cable module of claim 1, further comprising:

a microcontroller mounted to the PCB and configured to, in a mounted state of the cable module to the backplane panel, receive output signals from the pogo pins and determine identification information of the cable module mounting location to which the cable module is mounted based on the output signals from the pogo pins.

3. The cable module of claim 2, wherein each of the pogo pins is configured to output a first signal in response to engaging a conductive element on the backplane panel and to output a second signal in response to engaging a non-conductive element on the backplane panel.

4. The cable module of claim 3, wherein each of the pogo pins is connected through a resistor to a voltage source carrying a first predetermined voltage, the second signal comprises the first predetermined voltage, and the first signal comprises a second predetermined voltage.

5. The cable module of claim 1, further comprising:

a first pogo pin unit comprising two of the pogo pins; and a second pogo pin unit comprising two of the pogo pins, wherein the first pogo pin unit and the second pogo pin unit are mounted to opposite faces of the PCB directly opposite from one another.

6. The cable module of claim 5, wherein the first pogo pin unit and the second pogo pin unit are identical.

7. The cable module of claim 6, wherein the first pogo pin unit and the second pogo pin unit each comprise two 90-degree attachment pins which are asymmetrical and electrically connected to the PCB.

8. The cable module of claim 7, wherein for each of the first pogo pin unit and the second pogo pin unit, the two 90-degree attachment pins comprise a long attachment pin and a short attachment pin.

9. A computing system, comprising:

a system board comprising a processor;

a chassis supporting the system board and defining a plurality of bays to removably receive media drives;

a backplane panel comprising a plurality of cable module mounting locations corresponding to the plurality of bays, respectively, each of the cable module mounting locations comprising a connector receptacle and an identification array which encodes identification information of the cable module mounting location;

a plurality of cable modules mounted to the backplane panel at the plurality of cable mounting locations, respectively;

wherein each of the cable modules comprises:

a connector printed circuit assembly (PCA) comprising:

a printed circuit board (PCB);

a connector mounted to the circuit board and received in the cable receptacle of the cable module mounting location at which the respective cable module is mounted, the connector configured to receive a drive connector of a media drive;

a plurality of pogo pins mounted to the PCB and engaged with the identification array of the cable module mounting location at which the respective cable module is mounted;

a cable electrically connected to the PCA and to the system board.

10. The computing system of claim 9, wherein each of the cable modules comprises a microcontroller mounted to the PCB and configured to receive output signals from the pogo pins and determine identification information of the cable module mounting location to which the cable module is mounted based on the output signals from the pogo pins.

11. The computing system of claim 10, wherein each of the identification arrays comprises identification elements positioned to engage the pogo pins of one of the cable modules, each of the identification elements comprising a conductive element or a non-conductive element;

wherein the identification arrays encode the identification information based on the numbers and locations of the conductive elements and the non-conductive elements in the identification array;

wherein each of the pogo pins is configured to output a first signal in response to engaging a conductive element in one of the identification arrays and to output a second signal in response to engaging a non-conductive element in one of the identification arrays.

12. The computing system of claim 11, wherein each of the pogo pins is connected through a resistor to a voltage source carrying a first predetermined voltage, wherein each conductive element is connected to a voltage source carrying a second predetermined voltage, and wherein the second signal comprises the first predetermined voltage, and the first signal comprises a second predetermined voltage.

13. The computing system of claim 11, wherein the backplane panel is conductive and the conductive elements comprise portions of the backplane panel, and wherein the non-conductive elements comprise apertures in the backplane panel.

14. The computing system of claim 9, wherein each of the cable modules comprises a first pogo pin unit comprising two of the pogo pins, and a second pogo pin unit comprising two of the pogo pins, wherein the first pogo pin unit and the second pogo pin unit are mounted to opposite faces of the PCB directly opposite from one another.

15. The computing system of claim 14, wherein the first pogo pin unit and the second pogo pin unit are identical.

16. The computing system of claim 15, wherein the first pogo pin unit and the second pogo pin unit each comprise two 90-degree attachment pins which are asymmetrical and electrically connected to the PCB.

17. The computing system of claim 16, wherein for each of the first pogo pin unit and the second pogo pin unit, the two 90-degree attachment pins comprise a long attachment pin and a short attachment pin.

18. A method, comprising:
providing backplane panel comprising a plurality of cable module mounting locations;
encoding identification information for each of the cable module mounting locations in identification arrays at the cable module mounting locations, each identification array comprising an array of identification elements;
mounting a plurality of cable modules to the backplane panel at the plurality of cable mounting locations, respectively;
identifying the cable module mounting locations to which each of the cable modules are mounted by sensing outputs signals from pogo pins mounted to a printed circuitry board (PCB) of each of the cable modules, the pogo pins of each cable module being engaged with the identification elements of the identification array of the cable module mounting location at which the respective cable module is mounted.

19. The method of claim 18,
wherein the identification elements of the identification arrays comprise conductive elements and non-conductive elements;
wherein identifying the cable module mounting locations to which each of the cable modules are mounted comprises supplying a first voyage to the pogo pins via resistors, supplying a second voltage to the conductive elements, and determining whether the output signals of the pogo pins are at the first voltage or at the second voltage.

20. The method of claim 18, further comprising:
for each of the cable modules, mounting a first pogo pin unit comprising two of the pogo pins to a top face of the PCB and mounting a second pogo pin unit comprising two of the pogo pins to a bottom face of the PCB directly opposite from the first pogo pin unit.

* * * * *